United States Patent
Jin et al.

(10) Patent No.: US 9,524,897 B2
(45) Date of Patent: Dec. 20, 2016

(54) END HANDLER FOR FILM AND FILM FRAMES AND A METHOD THEREOF

(71) Applicant: Semiconductor Technologies & Instruments Pte Ltd, Singapore (SG)

(72) Inventors: Jian Ping Jin, Singapore (SG); Lee Kwang Heng, Singapore (SG)

(73) Assignee: SEMICONDUCTOR TECHNOLOGIES & INSTRUMENTS PTE LTD, Singapore (SG)

( * ) Notice: Subject to any disclaimer, the term of this patent is extended or adjusted under 35 U.S.C. 154(b) by 8 days.

(21) Appl. No.: 14/390,029

(22) PCT Filed: Mar. 22, 2013

(86) PCT No.: PCT/SG2013/000117
§ 371 (c)(1),
(2) Date: Oct. 2, 2014

(87) PCT Pub. No.: WO2013/154501
PCT Pub. Date: Oct. 17, 2013

(65) Prior Publication Data
US 2015/0076849 A1    Mar. 19, 2015

(30) Foreign Application Priority Data
Apr. 9, 2012  (SG) .................. 201202542

(51) Int. Cl.
*H01L 21/683* (2006.01)
*B25J 15/06* (2006.01)
*H01L 21/687* (2006.01)

(52) U.S. Cl.
CPC ........ *H01L 21/6838* (2013.01); *B25J 15/0616* (2013.01); *H01L 21/68707* (2013.01)

(58) Field of Classification Search
CPC ................................................ H01L 21/6838
USPC ............... 294/2, 213, 103.1, 106, 902, 64.3, 186,294/188, 189, 183; 901/31, 39, 40; 414/941
See application file for complete search history.

(56) References Cited

U.S. PATENT DOCUMENTS

| 4,639,028 | A |   | 1/1987  | Olson |
| 5,164,905 | A |   | 11/1992 | Iwasaki et al. |
| 5,380,137 | A | * | 1/1995  | Wada ............... H01L 21/67309 414/172 |

(Continued)

FOREIGN PATENT DOCUMENTS

| CN | 1653211 A  | 8/2005  |
| JP | 01289135 A | 11/1989 |

(Continued)

*Primary Examiner* — Paul T Chin
(74) *Attorney, Agent, or Firm* — Horizon IP Pte. Ltd.

(57) ABSTRACT

An end handler and method for processing a device are presented. The end handler includes a mating portion for mating with a tool and a support portion for supporting a film frame on a support surface. The support portion includes a support base section, extension sections extending from the support base section, and vacuum ports on the support surface for facilitating mating of the film frame on the support surface. Each of the vacuum port includes at least one reservoir having at least one vacuum opening in fluid communication with at least one vacuum source. The vacuum ports being configured to principally maintain a slimmest profile with strongest suction force possible.

17 Claims, 13 Drawing Sheets

(56) References Cited

U.S. PATENT DOCUMENTS

| | | | |
|---|---|---|---|
| 5,390,785 | A | 2/1995 | Garric et al. |
| 5,765,889 | A | 6/1998 | Nam et al. |
| 5,788,834 | A * | 8/1998 | Lapinski ............... C10G 11/05 208/113 |
| 5,857,667 | A | 1/1999 | Lee |
| 6,077,026 | A * | 6/2000 | Shultz ............... H01L 21/67778 294/188 |
| 6,189,943 | B1 | 2/2001 | Manpuku et al. |
| 6,336,787 | B1 | 1/2002 | Chang et al. |
| 6,942,265 | B1 * | 9/2005 | Boyd ............... H01L 21/67742 294/189 |
| 7,055,875 | B2 * | 6/2006 | Bonora ............... H01L 21/6838 294/188 |
| 7,434,856 | B2 * | 10/2008 | Gerhard ............ H01L 21/68707 294/188 |
| 8,864,202 | B1 * | 10/2014 | Schrameyer ......... B25J 15/0014 294/213 |
| 8,991,887 | B2 * | 3/2015 | Shin ................. H01L 21/67742 294/183 |
| 2004/0038498 | A1 | 2/2004 | Ozono et al. |
| 2005/0110292 | A1 | 5/2005 | Baumann et al. |
| 2006/0113806 | A1 * | 6/2006 | Tsuji ................. H01L 21/68707 294/213 |
| 2008/0129064 | A1 | 6/2008 | Harvey |
| 2009/0042281 | A1 | 2/2009 | Chang et al. |
| 2010/0247763 | A1 | 9/2010 | Coutu et al. |

FOREIGN PATENT DOCUMENTS

| | | |
|---|---|---|
| JP | 2001015537 A | 1/2001 |
| JP | 2006278629 A | 10/2006 |
| JP | 2006289591 A | 10/2006 |
| JP | 2009016528 A | 1/2009 |
| WO | 00/02808 A1 | 1/2000 |
| WO | 03087436 A1 | 10/2003 |
| WO | 2007/023501 A2 | 3/2007 |

* cited by examiner

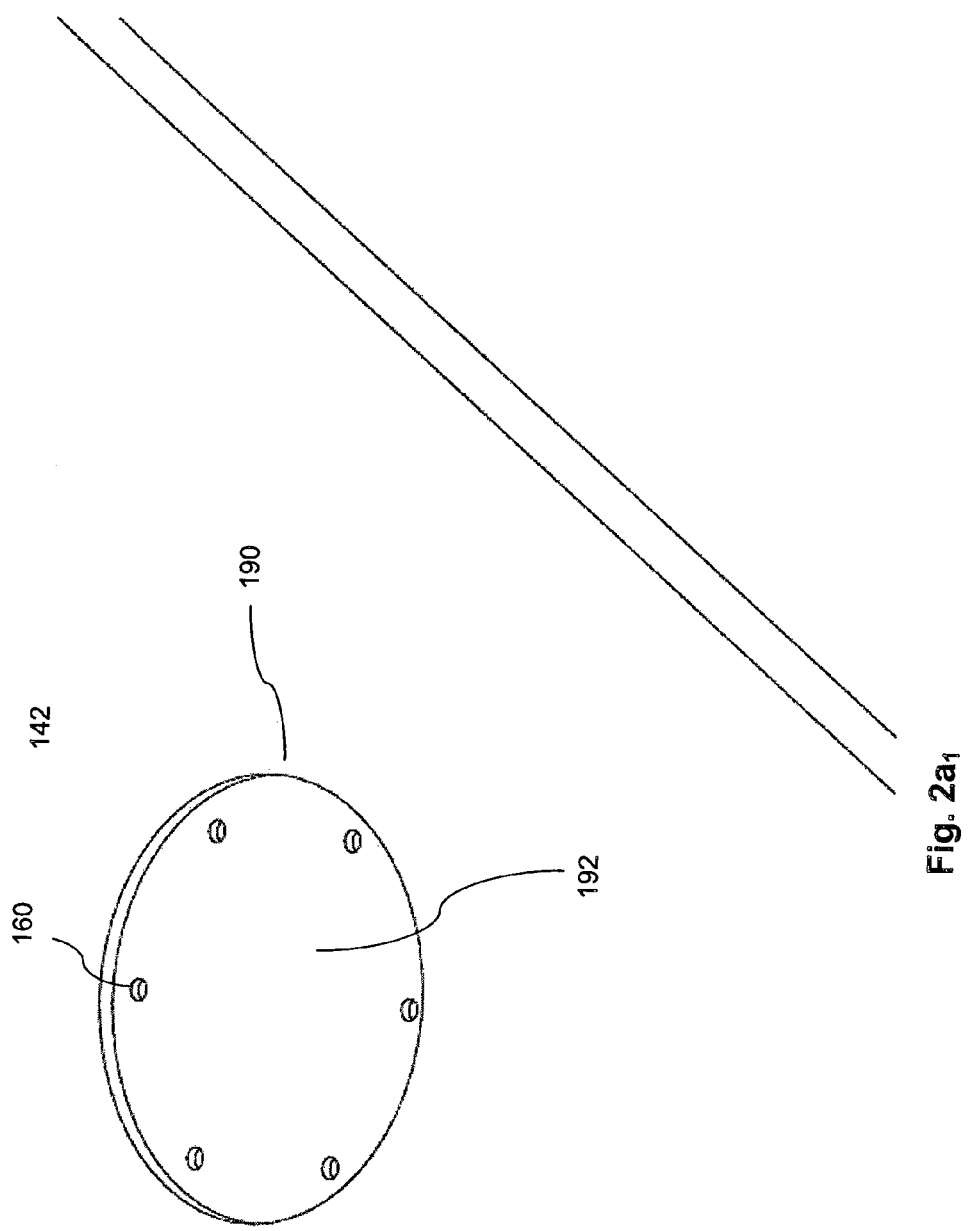

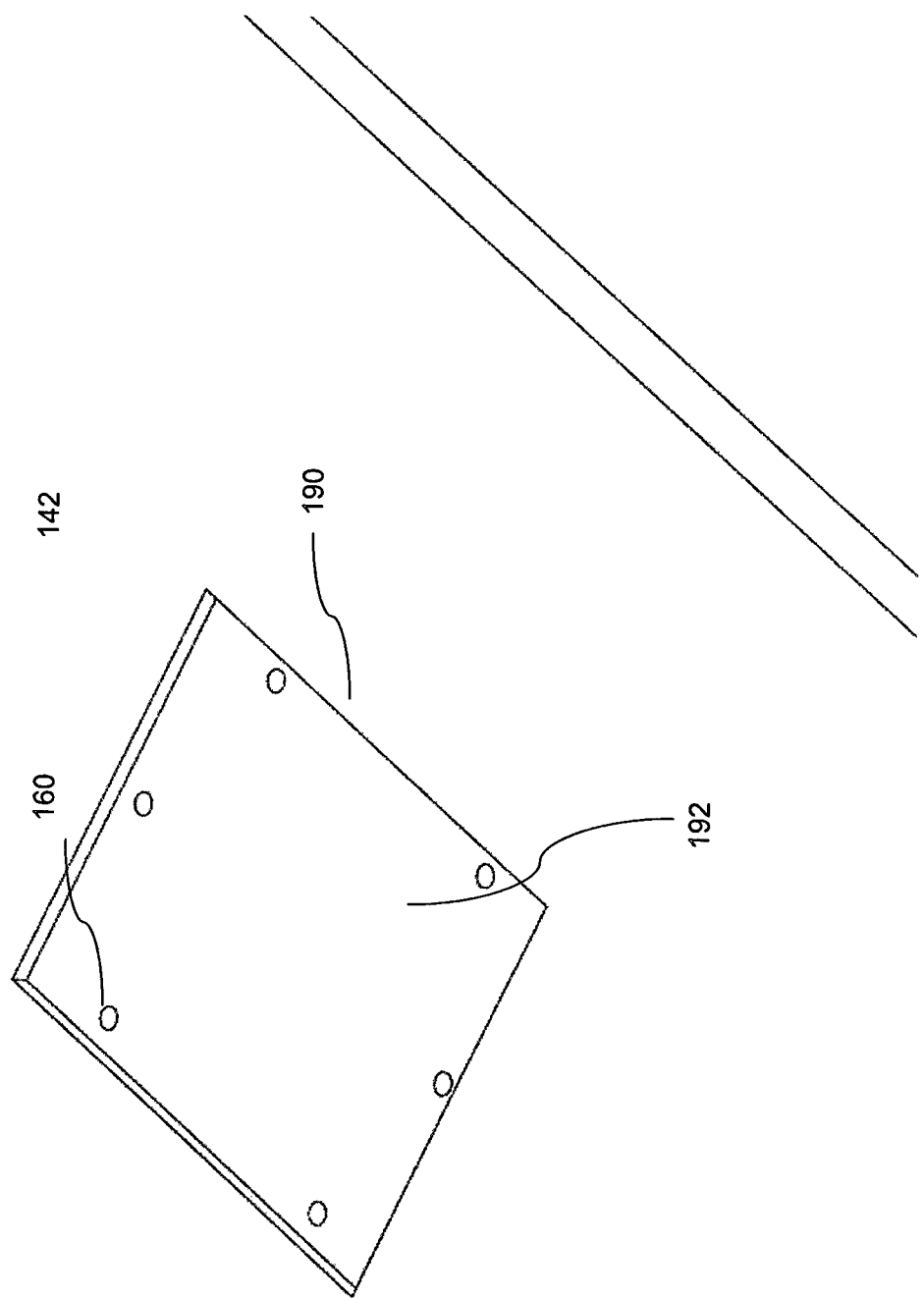

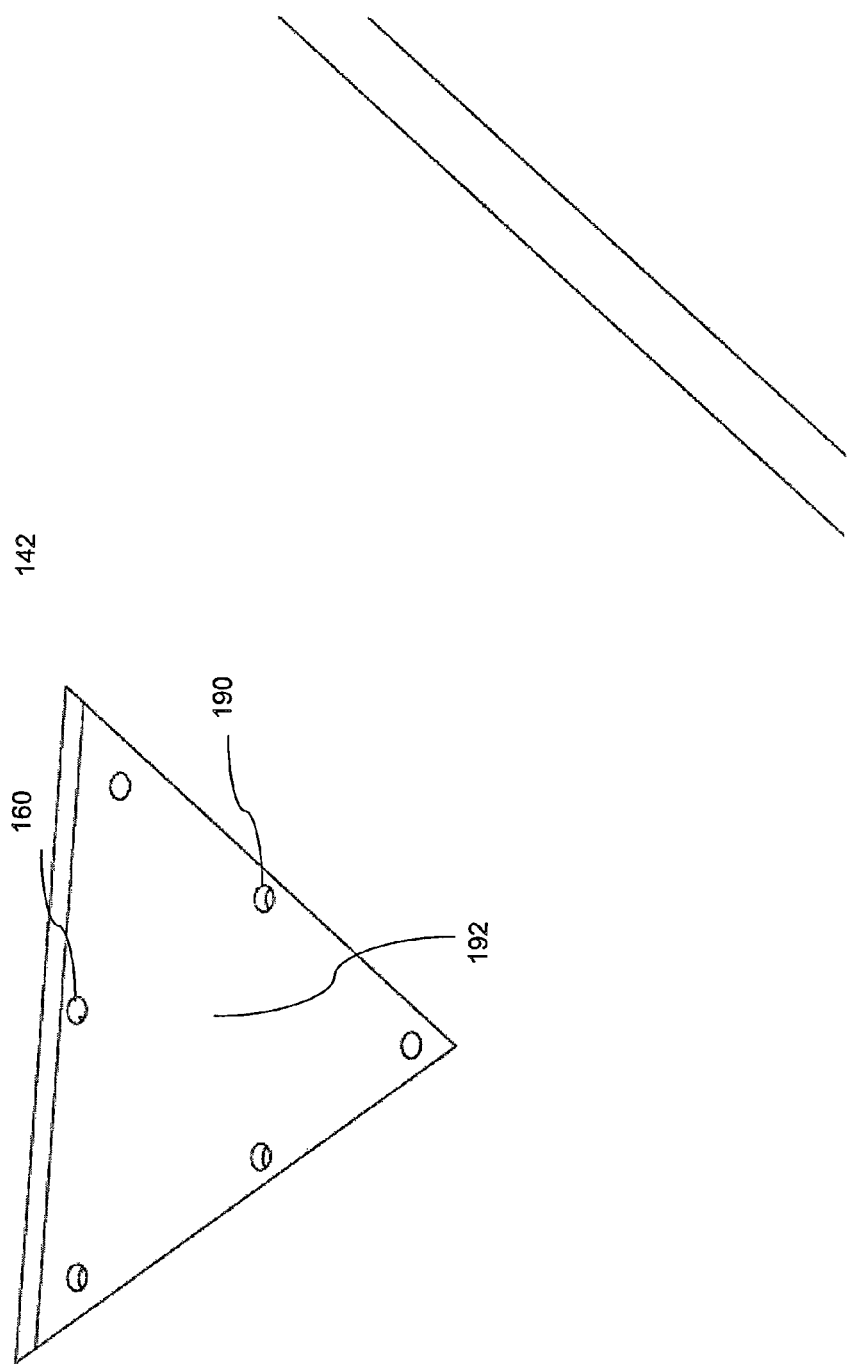

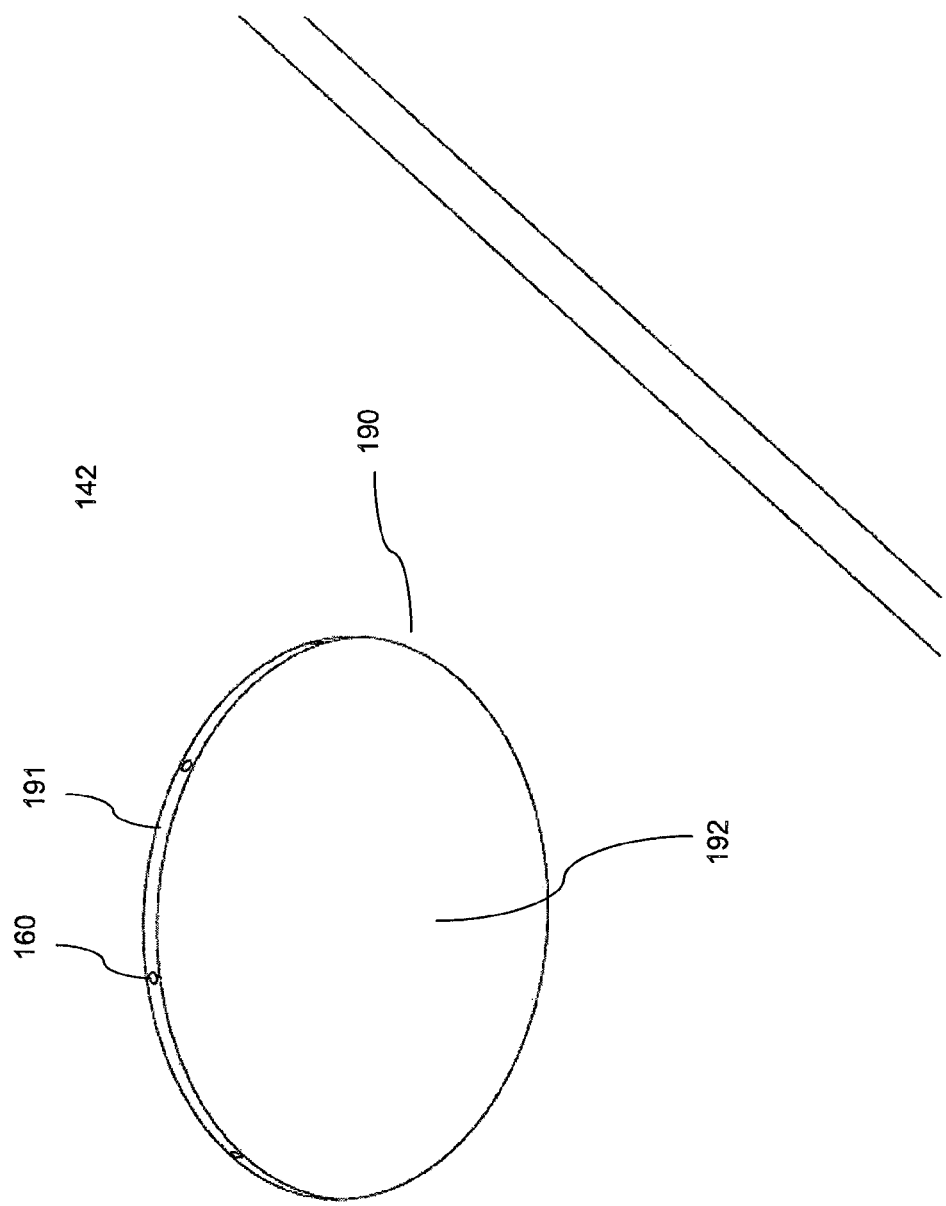
Fig. 2a₄

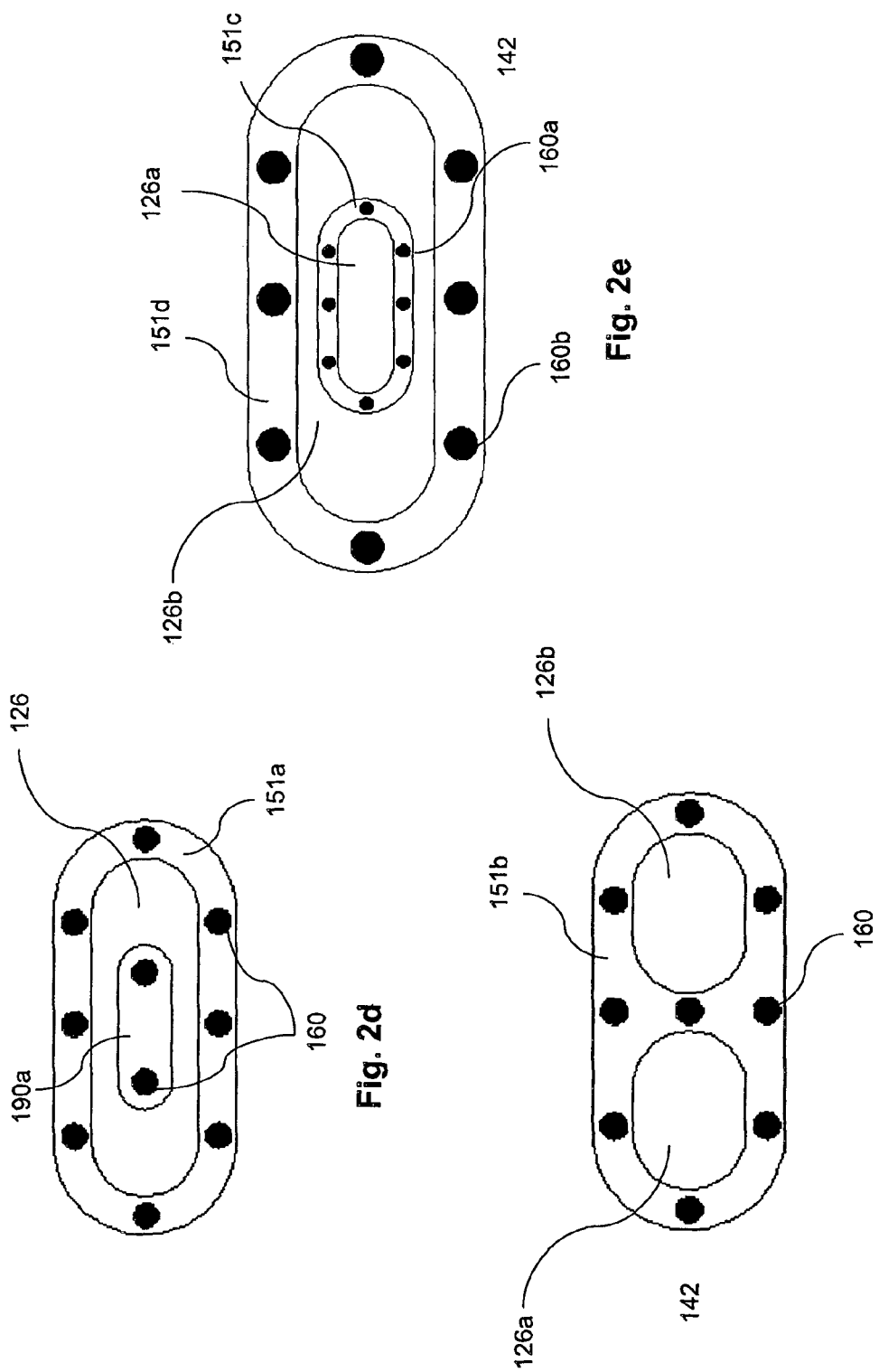

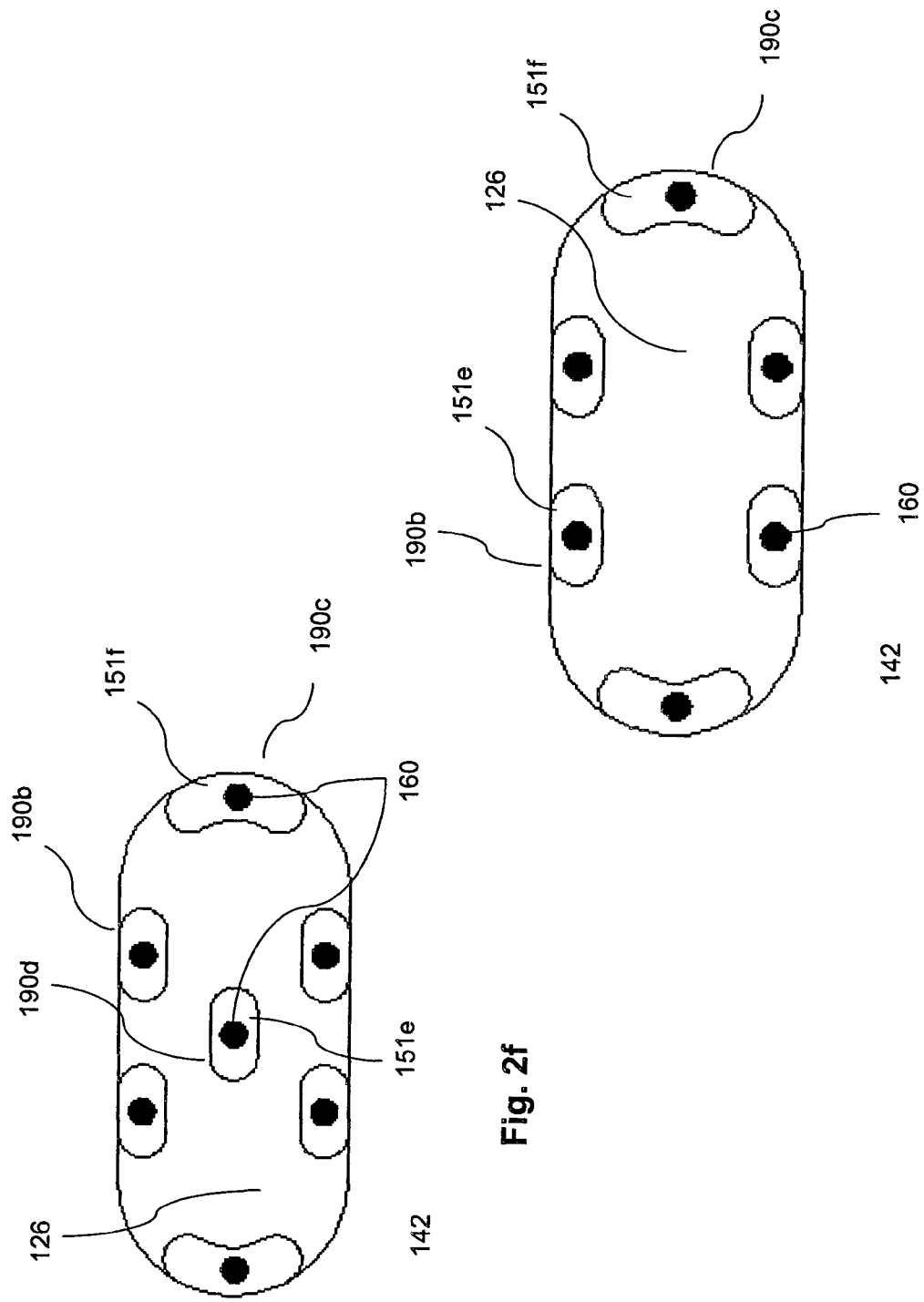

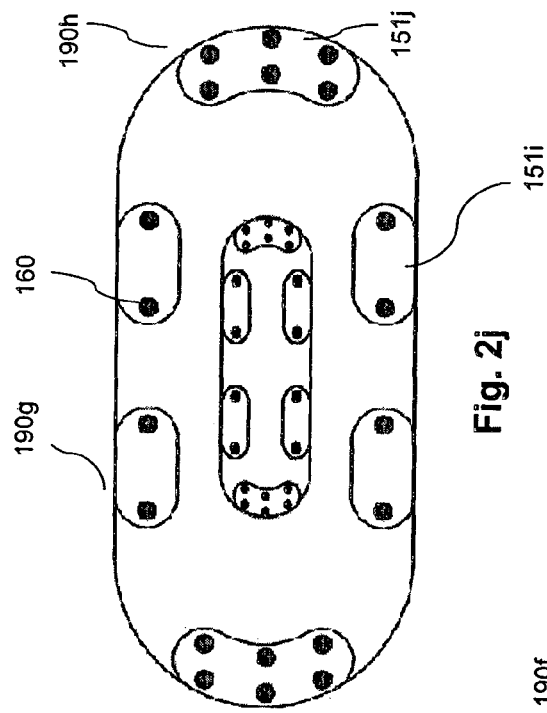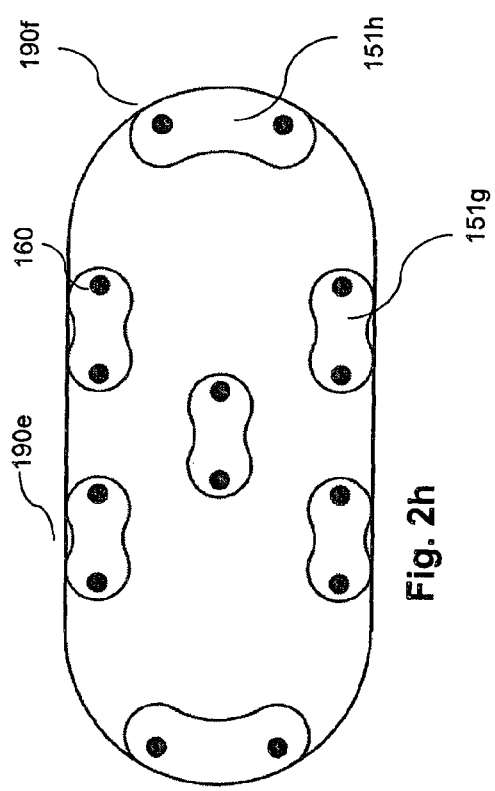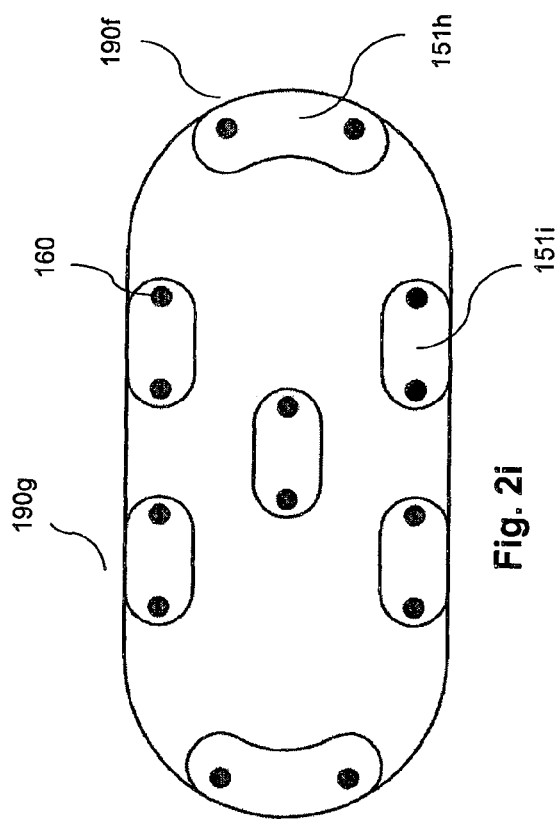

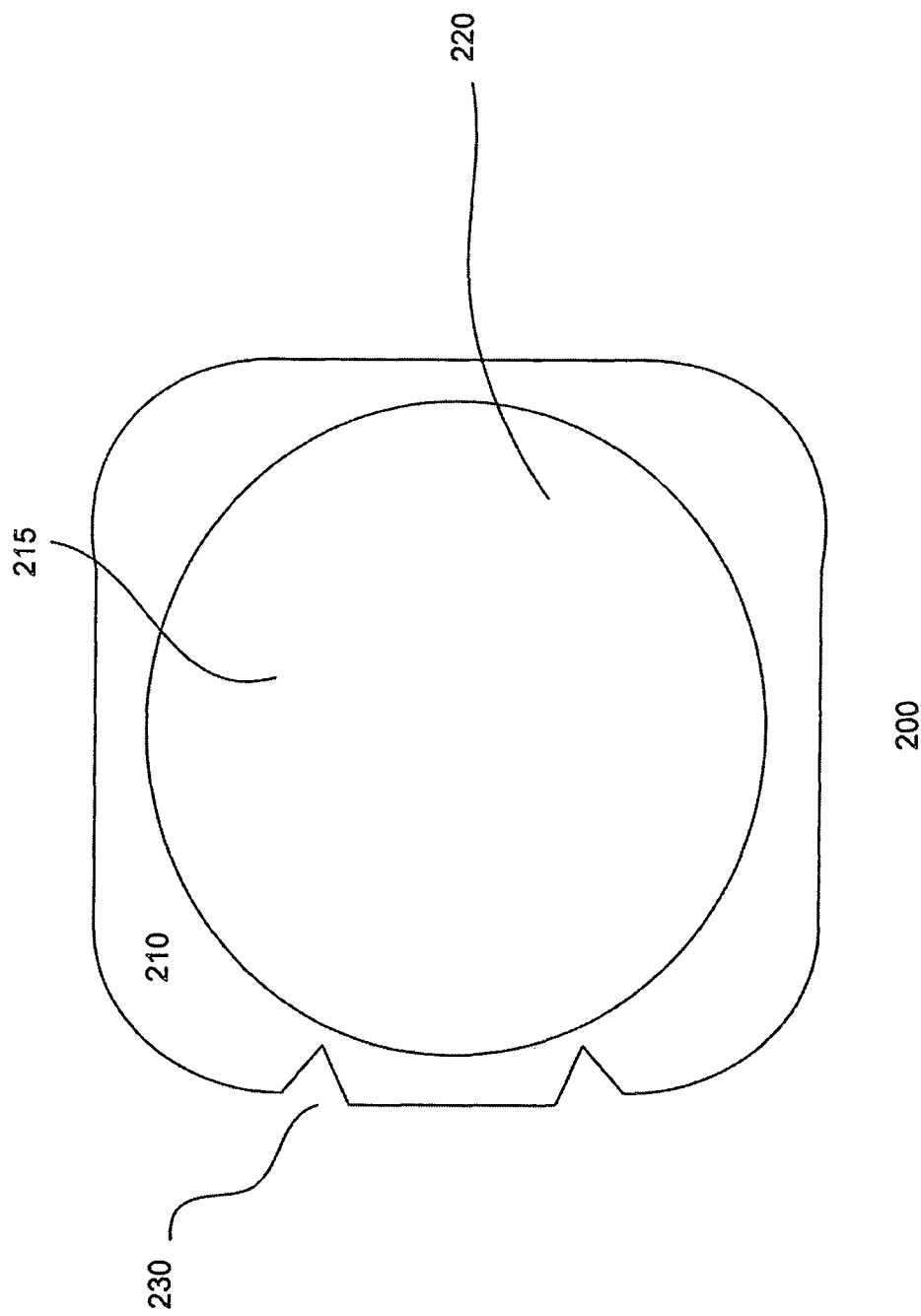

END HANDLER FOR FILM AND FILM FRAMES AND A METHOD THEREOF

BACKGROUND

End handler described herein is widely used in handling or transferring of a film frame in semiconductor manufacturing process.

The end handler is normally coupled to a robotic arm of a wafer manufacturing tool (such as wafer dicing tool and wafer inspection tool) to handle and transport these film frames. At this stage, finished processed whole wafers would have been attached onto film frames. The film frame consists of a rigid frame, usually made of steel, with a circular see through portion patched with a thin film where the whole processed wafer would be attached. After mounting on the film frame, these wafers on film frames would be loaded into cassettes to allow for the next stage of processing of the wafers, which could involve dicing, inspecting for defects or testing. The end handler is used to load and unload these film frames and to move one or more film frames from one position to another.

Conventionally, end handler includes at least two fingers for supporting, handling or holding an article, such as a film frame. These fingers are equipped with vacuum pads of various designs. In one conventional design, the vacuum pads consist of tiny openings on the surface of the end handler that suck against the metal frame of the film frame. In another, the vacuum pads consist of protruded vacuum pads having upward facing openings with a raised height which extends beyond the top or upper surface of the end handler to suck against the film of the film frame. In these conventional designs, when vacuum pressure is applied through the tiny openings in the vacuum pads, they purport to hold the entire film frame during handling and transportation from one point to another in the wafer processing tool.

The use of end handlers with conventional vacuum pads as described above gives rise to several problems. In the case of vacuum pads sucking against metal frame, the non-pliable metal surface of the film frames does not allow for creation of an effective vacuum seal for vacuum suction to hold down the film frame.

In the case of protruded vacuum pads, the portions of the film in contact with the protruded vacuum pads will overtime become irreversibly distended or deformed. Further, the use of protruded vacuum pads increase the overall thickness of the end handlers and increases the difficulty of it accessing a standard cassette for handling film frames. The standard film frame cassette contains up to 25 wafers, and the space between the film frames in the cassette is only between 5 mm to 8 mm. In many instances, this gap between wafers is made smaller and uneven with a smaller gap towards the centre of the film frame because of the attached wafer weighing down the film. The use of protruded vacuum pads increases the overall thickness of the end handler which makes accessing the cassette, already a very delicate operation even more so. Any mistake in its access will cause damage to the attached valuable wafers and to the end handler itself. In some cases, it may be necessary to leave alternate slots of the film frame empty to facilitate easier access of the end handler for retrieval or loading. This means that cassette would have to be re-loaded more often resulting in more down time of the automated tool. This affects overall efficiency.

However, the most important weakness of all conventional designs is that they all suffer from having weak suction force. The conventional designs involving the application of vacuum force through tiny holes on the vacuum pads (whether protruded or not) directly against the film of, or the metal frame of, the film frame which do not provide a strong enough vacuum force to hold the film frame in place. The inability to apply a large enough suction force is particularly significant when these film frames have to be moved at higher speeds. At higher speeds, without a strong or stronger vacuum force, the film frame will slide or drop off while being transported.

From the foregoing discussion, it is desirable to provide an end handler that can efficiently and speedily handle a film frame securely without any of the problems associated with conventional systems described above.

SUMMARY

Embodiments herein generally relate to an end handler and method of handling a film frame. The following description is applicable to the stage where the film frame with wafers mounted have been loaded into a cassette ready for the next stage of semiconductor manufacturing process (dicing, inspection or testing, etc.).

The end handler of the present invention includes a lower support portion that connects to a tool and a support portion for supporting a film frame (not shown) on a support surface. The support portion includes a support base section with extension sections (or fingers) extending from the support base section and at least one vacuum port on the support surface to facilitate the adherence of the film frame against the support surface when the vacuum source is activated.

A key feature of the present invention relates to the design of the vacuum port on the end handler. The at least one vacuum port includes at least one reservoir with the at least one vacuum opening disposed near to the side of the walls of the reservoir. The reservoir is a shallow indentation (recess) from the surface of the end handler and has a surface opening which comes into contact with the film of the film frame when the latter is loaded on the end handler. Disposal of the at least one vacuum openings near to the walls of the reservoir allows the film above near the edge of the reservoir to be effectively sucked downwards against the edge of the reservoir without distending too much the film covering the reservoir at the centre. The area of surface opening is many times the area of the openings of the vacuum openings. The size of the surface opening of the reservoir depends on the pliability of the film (or other pliable material) of the film frame. It should not be too large as to cause the film to be much distended downwards into the reservoir which may reduce the surface area for suction if the film touches the base of the reservoir.

Another embodiment of the present invention is the use of a larger reservoir (when desired) that has at least one port island having a top surface which is about coplanar with the top surface of the end handler. In the presence of the at least one port island, the side walls of the reservoir, together with the side walls of the port island, forms a ported groove which is a substantially continuous open channel that substantially surrounds the at least one port island; and at least one vacuum opening in the ported groove. The ported groove gives support to the film and prevents distension of the film of the film frame while vacuum is applied through the ported groove.

The principal object of the above embodiments is to increase the surface area through which a vacuum is applied. The above embodiments of present invention of vacuum ports of the end handler allows for vacuum force of the vacuum openings to be significantly augmented through simple hydraulic principles; the area of the surface opening of each reservoir and the surface area of the channel opening of the ported groove that substantially surrounds the at least, one port island is many times the area of the opening of the vacuum hole. This relatively larger area of the surface opening of the reservoir and the ported groove compared to the vacuum opening, increases significantly (multiplies) the effective suction force otherwise applied by an at least one vacuum opening if they had been applied directly onto the film of the film frames.

The ported groove and reservoir are fluidly in communication with the vacuum source through the vacuum openings.

It is conceivable that the elements of the above embodiments may be varied to create other embodiments of the invention. In one embodiment, the at least one reservoir may contain one or more port islands. The wall of the at least one reservoir and port islands form a continuous ported groove around the port islands. At least one vacuum opening is disposed in the ported groove, the at least one vacuum opening being fluidly in communication with at least one vacuum source. In one embodiment, the at least one port island in question contains at least one reservoir with the at least one vacuum opening that is fluidly communicating with the vacuum source to enhance the suction force of the respective vacuum ports as a whole. In one embodiment, the vacuum ports could present itself as a series of discrete reservoirs (with at least one vacuum opening) that line the perimeter of the port island, forming a discontinuous ported groove. It is conceivable that in each of the above embodiments, the respective vacuum ports could include multiple port grooves (in all its variations) fanning out concentrically if so desired, again, to increase suction force being applied through the increased area provided by the continuous channel openings of the ported groves or discontinuous reservoirs.

These embodiments, along with other advantages and features herein disclosed, will become apparent through reference to the following description and the accompanying drawings. Furthermore, it is to be understood that the features of the various embodiments described herein are not mutually exclusive and it is conceivable that further other embodiments could be created that involve other permutations and combinations of any of the features of the above embodiments.

BRIEF DESCRIPTION OF THE DRAWINGS

In the description that follows, like parts are marked throughout the specification and drawings with the same reference numerals, respectively. Also, the drawings are not drawn to scale, emphasis instead generally being placed upon illustrating the principles of the invention. Various embodiments of the present invention are described with reference to the following drawings, in which.

Figure 2B:
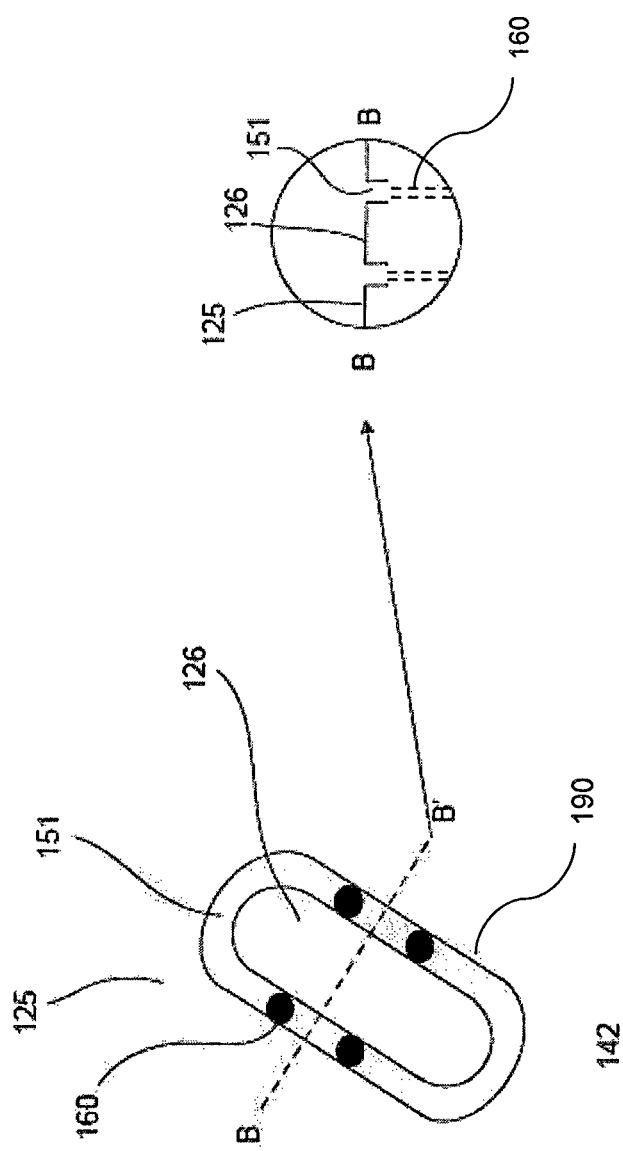
Figure 4:
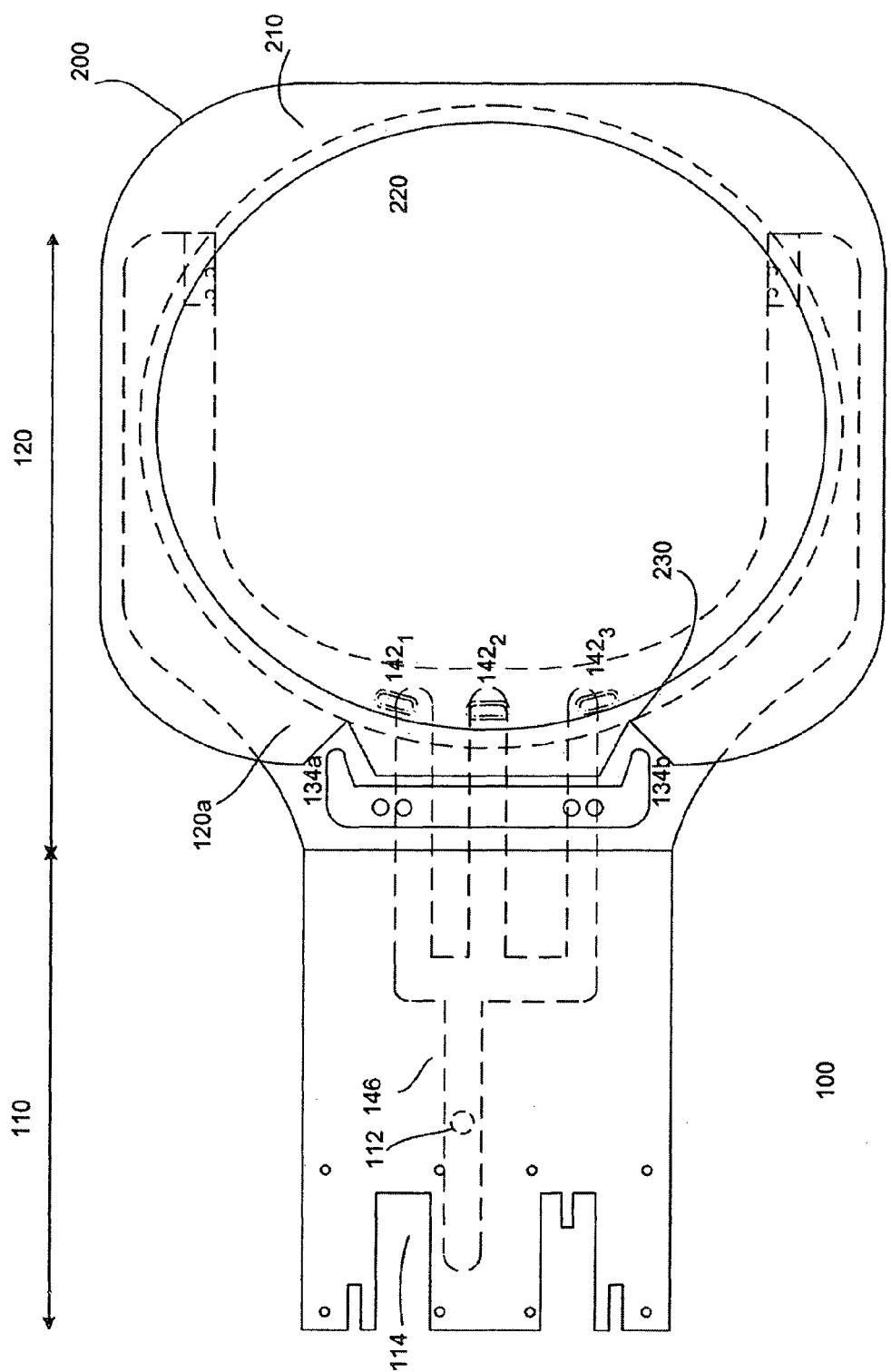
Figure 5:
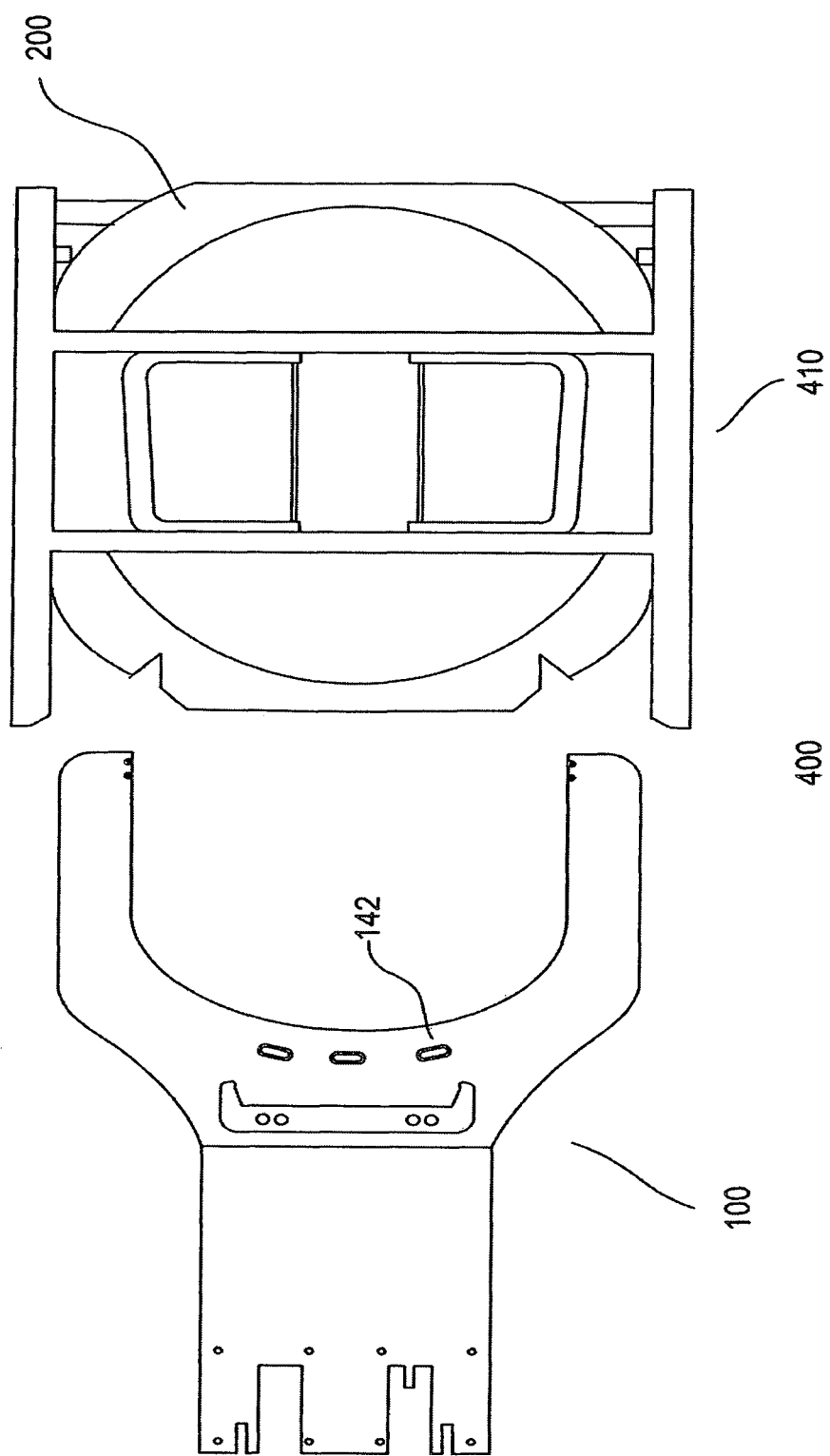
Figure 6:
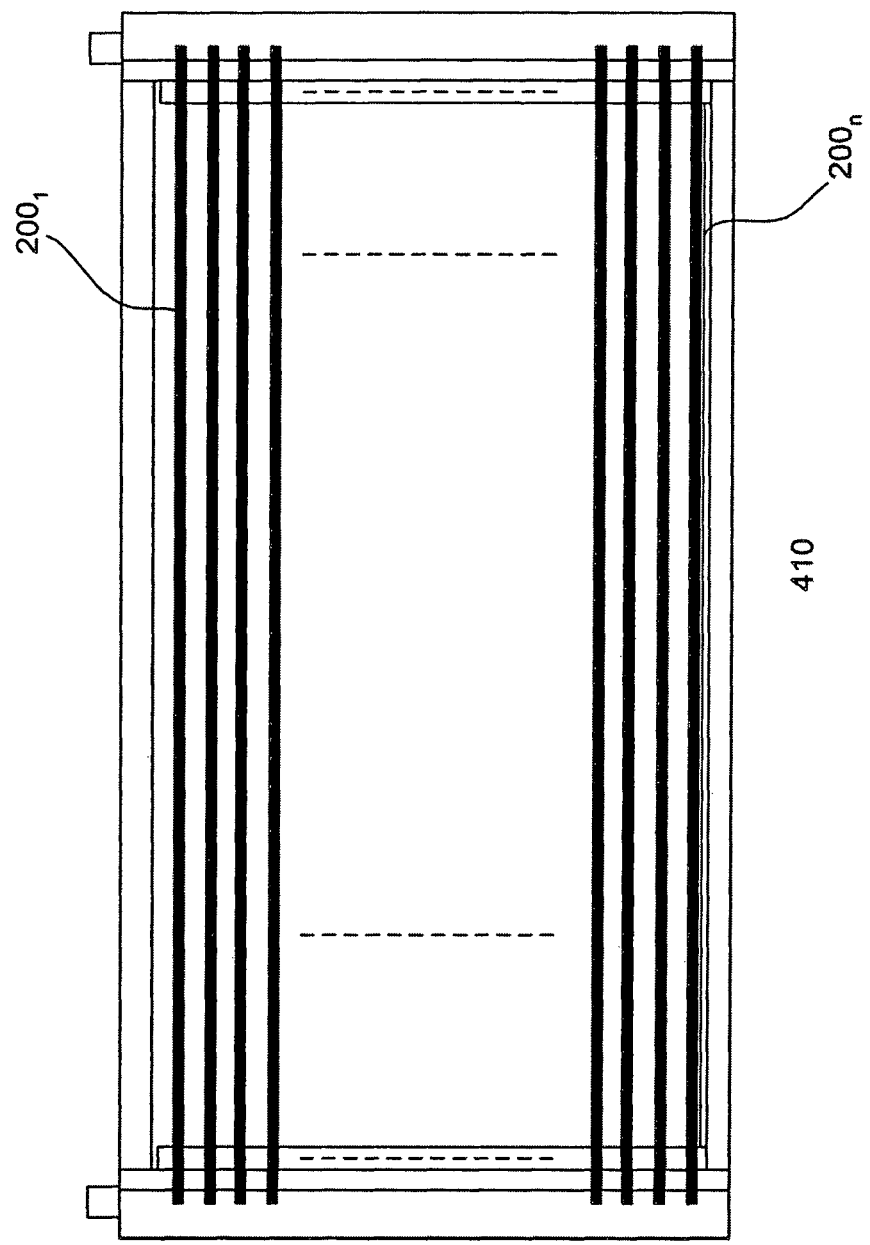

FIGS. $2a_1$-$2a_4$ show a series of embodiments of vacuum ports comprising at least one reservoir;

FIG. 2b shows an embodiment of a vacuum port comprising a reservoir and port island;

FIG. 2c shows an embodiment of a multi-port island vacuum port;

FIG. 2d shows an embodiment of a vacuum port comprising of the basic configuration of the at least one port island with at least one reservoir in concentric arrangement;

FIG. 2e shows an embodiment of a vacuum port comprising of the basic configuration of the at least one reservoir with a port island in concentric arrangement;

FIG. 2f shows an embodiment of a vacuum port comprising a plurality of reservoirs forming a discontinuous ported groove;

FIG. 2g shows an embodiment of a vacuum port comprising a plurality of reservoirs forming a discontinuous ported groove;

FIG. 2h shows an embodiment of a vacuum port comprising a plurality of reservoirs forming a discontinuous ported groove with the plurality of reservoirs having different shapes;

FIG. 2i shows an embodiment of a vacuum port comprising a plurality of reservoirs forming a discontinuous ported groove each having at least one vacuum opening;

FIG. 2j shows an embodiment of a vacuum port comprising a plurality of reservoirs in concentric arrangement;

FIG. 3 shows a film frame that may be handled by an embodiment of present end handler;

FIG. 4 shows a film frame mated or adhered to an embodiment of an end handler;

FIG. 5 shows a top view of a process in which an end handler is employed to load or unload film frames from a cassette used to contain and transport the film frames; and FIG. 6 shows an embodiment of a cassette holder with film frames.

DETAILED DESCRIPTION

The present disclosure relates to an end handler used to facilitate the handling and transporting of film frame to and from a cassette in a semiconductor manufacturing process.

The end handler is preferably formed of suitably a rigid material (usually steel) sufficiently strong to support the film frame which carries on its film a suit of dies or a whole wafer.

Figure 1:
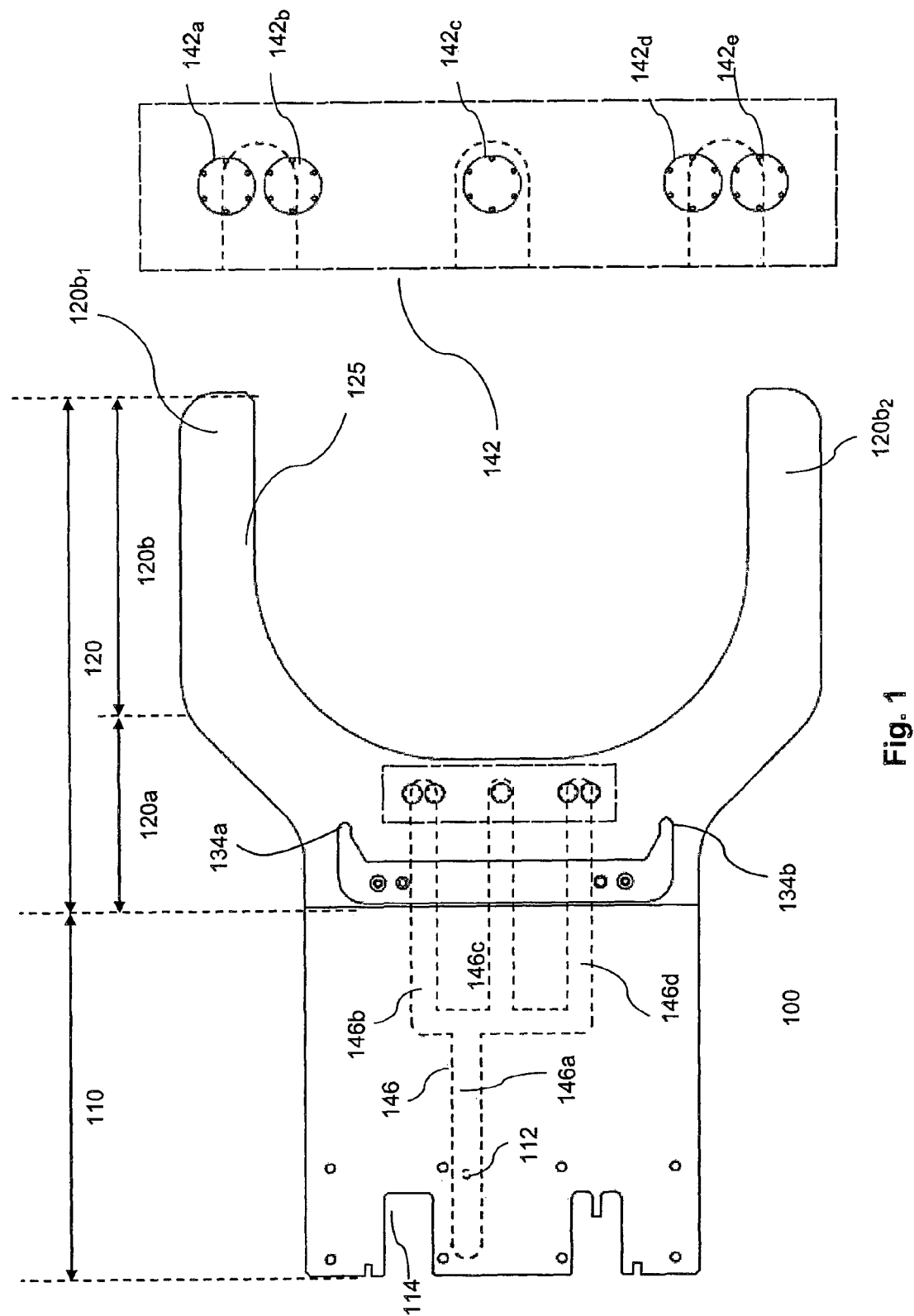
FIG. 1 shows an embodiment of an end handler with vacuum port of present invention.

FIG. 1 shows a preferred embodiment of an end handler 100 used in a semiconductor process or tool to handle or transport a film frame. The end handler 100 includes a lower support portion 110 that has coupling slots 114 to connect to a tool (not shown) and a support portion 120 for supporting a film frame (not shown) on a support surface 125. The support portion 120 of the end handler consists of a U-shaped portion, having a support base section 120a and finger or extension sections $120b_1$ and $120b_2$ extending therefrom to give support to the film frame, and at least one vacuum port ($142_a$, $142_b$, $142_c$, $142_d$ and $142_e$) on the support surface to facilitate the adherence of the film frame against the support surface 125; during retrieval, loading and/or transportation.

FIG. 3 shows a typical film frame 200. As shown, the film frame includes a frame 210. The frame is a ring shaped frame having an opening 215 therein which holds a film. For example, film frames may be of different sizes and shapes to accommodate different sized and shapes wafers. Although the present embodiment shows the support portion 120 of the end handler 100 to have a U-shaped extension portion, it is conceivable that other shapes of the extension is possible or may be desired corresponding to the shape and size of the film frame so long as it is able to provide the necessary support to the film frame during the operation of the end handler.

The opening 215 includes a polymer film 220 for attaching and supporting a wafer. The polymer film, for example, includes at least one surface which is tacky. The tacky surface or mounting surface, for example, is the surface on which a wafer is attached. The tacky surface facilitates holding the wafer on the polymer layer. Depending on the stage of processing, the wafer may be diced. For example, the wafer may be diced or singulated into individual devices or dies. In other embodiments, the wafer is un-diced.

FIG. 4 shows an embodiment of an end handler 100 with a film frame 200 mounted thereto. When the film frame 200 is being retrieved onto the end handler 100, the film frame 200 may be aligned by suitably placed registering elements $134_a$ and $134_b$ on the end handler 100 that couple with the corresponding aligners 230 on the film frame. However, during such retrieval by the end handler, actual registration by the registering elements may not be strictly necessary as the end handler is moved to a pre-determined position with respect to the film frame in the cassette. When end handler is moved to this pre-determined position, the vacuum ports $142_1$, $142_2$ and $142_3$ would be in pre-determined strategic locations with respect to the end handler and is in communication with the polymer film of the film frame when the vacuum is activated to effect retrieval.

It is possible to configure the support portion 120 of the end handler into other shapes and sizes to handle film frames of different shapes and sizes such as square, rectangular, circular, or oval depending on the shape of the film frame to be handled or transported. The support base portion 120a, for example, is contiguous with a receiving portion or finger or extension sections $120b_1$ and $120b_2$.

A vacuum network 146 comprising embedded vacuum grooves or channels (146a, 146b, 146c and 146d) within the end handler 100. The vacuum network 146 may extend from lower mating portion 110 to the support portion 120. The vacuum network 146 is fluidly communicable with a vacuum source. Although in the present embodiment, the embedded grooves or channels (146a, 146b, 146c and 146d) are shown only near the base of the support portion 120a, it is conceivable that the network of vacuum grooves or channels (146a, 146b, 146c and 146d) may run along the length of extension sections $120b_1$ and $120b_2$ or be located in any other part of the end handler if so desired or necessary where vacuum ports may be located. More than one vacuum source may be provided to the end handler.

FIG. 5 illustrates the top view of a process 400 in which an end handler 100 is employed to load or unload film frames 200 from a standard cassette 410 used to contain and transport the film frames. FIG. 6 shows a frontal view of the cassette 410. A cassette is a container configured to fit a plurality of film frames $200_{1-n}$ used in the manufacturing process. As discussed, a film frame is used to handle a wafer or singulated dies that is attached onto the film of the film frame in the manufacturing process. A standard cassette is configured to fit 25 eight inch film frames (e.g., n=25), corresponding to the typical lot size in semiconductor manufacturing for eight inch wafers. In this regard, the end handler would have to navigate within the very limited space between each pair of the horizontal slots. The distance between the two adjacent film frames is typically 5 mm to 8 mm. As will be explained later, the embodiments of the end handler of the present invention has a much thinner profile and allows the end handler to easily access the cassette to retrieve or load the film frame.

FIG. $2a_1$ is a drawing exemplifying an embodiment of the vacuum port 142 of the present invention. The at least one vacuum port 142 at its most basic configuration includes at least one reservoir 190 and each reservoir 190 has at least one vacuum opening 160 disposed therein. The reservoir 190 is a shallow indentation (recess) from the surface of the end handler and has a surface opening 192 which comes into contact with the film of the film frame when the latter is loaded on the end handler 100. In one embodiment shown in FIG. $2a_4$, the at least one vacuum opening 160 could be disposed to the base of the reservoir near to its wall 191 or also on the wall 191 of the reservoir 190. Suitably sized at least one vacuum opening 160 disposed near to and/or on the wall 191 of the reservoir 190 allows the film 220 above and near the edge of the reservoir 190 to be effectively sucked downwards too much against the edge of the reservoir without distending downwards the film 220 near the centre of the reservoir. The area of surface opening 192 of the reservoir 190 that would be in communication with the film 220 is many times the area of the openings of the vacuum openings 160. The size of the surface opening 192 of the reservoir 190 depends on the pliability of the film (or other pliable material) 220 of the film frame. It should not be too large as to cause the film to be much distended downwards into the reservoir when vacuum is applied. It is apparent that such reservoirs may take different shapes and sizes as may be desired or necessary. FIGS. $2a_2$ and $2a_3$ show other embodiments of vacuum ports with reservoirs of different shapes and sizes.

FIG. 2b is another embodiment of the present invention where the vacuum port 142 comprises at least one reservoir 190 having at least one port island 126 having a top surface which is substantially coplanar with the top surface of the end handler 125. In the presence of the at least port island 126, the reservoir 190 becomes a ported groove 151 which is substantially a continuous open channel that substantially surrounds the at least one port island 126; and the ported groove 151 having at least one vacuum opening 160 disposed in the ported groove 151. The vacuum openings 160 could be located at the base of the ported groove or at the side walls of the ported groove. The at least one vacuum opening 160 opens to the ported groove 151 and is fluidly communicable with the vacuum source 112 through the vacuum network 146. The channel of the ported groove 151 opens to and is in communication with the film 220 of the film frame when the latter is loaded to the end handler. When vacuum is applied, the ported groove 151 will suck down the film 220 while the at least one port island 126 gives support to the film 220 and prevents its distension.

The above embodiments of vacuum ports 142 of the end handler allows for vacuum force of the vacuum openings to be significantly augmented through simple hydraulic principles; the area of the surface opening 192 of each reservoir 190 and the surface area of the channel opening of the ported groove 151 that substantially surrounds the at least one port island 126 is, respectively, many times the area of the opening of the vacuum hole. This relatively larger area of the surface opening of the reservoir 192 and the ported groove 151 respectively, through which vacuum force will be applied against the film 220, compared to the vacuum opening, increases significantly (multiplies) the effective suction force otherwise applied by the at least one vacuum opening 160 if they had been applied directly onto the film of the film frames, when vacuum source 112 is activated.

To hold the film frame 200 to the end handler 100 during handling (loading, retrieval or transportation), at least one vacuum port 142 is provided on the support surface suitably positioned so that when the at least one vacuum port 142 is activated, the at least one vacuum port 142 would be in communication with the film 220 of the film frame, to facilitate suction which effectively holds down the entire film frame to the surface of the support surface. When the vacuum source 112 is activated, the reservoir 190 and the ported groove 151 respectively of the respective embodiments, in communication with the film of the film frame, will suck the film over the reservoir and the open channel of the ported groove 151 respectively, to provide a vacuum seal which effectively holds down the film frame 200.

Unlike conventional systems where the tiny vacuum openings on vacuum ports directly contact the film of the film frame or the metal and provide the suction force on the film, the vacuum openings 160 of the present embodiment do not directly contact the film 220. When vacuum source 112 is activated, the vacuum openings 160 located within, and in fluid communication with, the reservoir 190 or the ported groove 151, allow vacuum force to be applied through the open surface of the reservoir 192 or the open channel of the ported groove 151 that substantially surrounds the port island 126.

In one embodiment seen in FIG. 2b, the open channel is continuous and surrounds the port island 126. In another embodiment seen in FIG. 2f, the vacuum port could be formed by a plurality of reservoirs (190a, 190b, 190c, etc.) which together form a discontinuous ported groove $151_e$ and $151_f$ suitably arranged to provide effective suction at strategic locations to hold down the film frame.

The reservoir 190 and the ported groove 151, in all their variations, in communication with the film 220 provides the relatively more extensive surface area for suction force to be applied against the film of the film frame. Vacuum suction is effected through the at least one vacuum openings 160 located within the reservoir 190 or the ported grooves 151 which are in fluid communication with a vacuum source 112. With a number of the vacuum ports suitably positioned on the end handler, the suction force achieved through the reservoirs or the open channel of the ported grooves 151 of these vacuum ports significantly magnifies the suction force that the vacuum openings 160 would otherwise exert on the film 220 than if the vacuum openings 160 were in direct contact with the film 220. This magnified force significantly increases the suction force applied to hold down the film frame 200 and allows the film frame to be handled more securely at much higher speeds. This magnified force is calculable through application of simple hydraulic principles. It can also be calibrated and controlled by software.

The at least one vacuum ports 142, when activated, temporarily attach the film (of the film frame) to the end handler for transportation. When transportation is completed, the at least one vacuum port 142 is deactivated to detach the film 220 from the end handler.

The presence of a port island 126 is significant. The port island 126 ensures that the at least one vacuum port 142 does not distend or deform the film 220 when vacuum is applied since both the top surface of the port island 126 and the surface of the end handler surrounding the ported grooves 151 are coplanar or substantially flushed. In fact the port island 126 serves to support and prevent the distension of the film 220 while suction is applied. Accordingly, the ported groove 151 should not be too wide as to cause the pliable film to be distended downwards without support. The co-planarity of the vacuum ports 142 (non-protruding) with the surface of the end handler ensures that the end handler so designed has a very slim profile and the strongest suction force possible.

Although the vacuum network 146 is depicted as a continuous loop which connects the vacuum source 112 to the at least one vacuum port 142 through the vacuum openings 160, other configurations of the vacuum network 146 may also be useful or desired as circumstances may dictate. For example, non-continuous loops of vacuum network may also be useful especially if unequal force may have to be applied from each of the at least one vacuum ports; in which case more than one vacuum source may be needed to be separately connected to these vacuum ports.

Unlike conventional system where the overall thickness of the end handler is increased because of the protruded vacuum ports, the overall profile of the present embodiment of the vacuum ports 142 in the end handler 100 remains thin as the vacuum ports 142 do not protrude. This means that the end handler can more easily access the minute space between each pair of slots in the cassette (approximate 5 mm to 8 mm) for retrieval or loading. As explained earlier, retrieval and loading of film frame is a very delicate operation given the confines of the space between the film frames which is made a lot narrower given that the polymer films (of the film frames) are usually weighed down by the heavy wafers they are carrying. An end handler with a thicker profile is likely to damage the wafers while accessing the cassette. A small change in thickness has a huge bearing on ease of access into the cassette. To prevent damage, the cassette cannot be loaded with every pair of slot carrying one film frame but with alternate pairs being left empty to provide the space needed for a thick profiled end handler. This reduces the overall efficiency of the semiconductor tool.

Although FIG. 1 shows an embodiment of the present end handler where the at least one vacuum port 142 has one reservoir 190, it is conceivable that the vacuum port may take on any other configuration in numbers, shapes and sizes as may be desirable or useful. FIG. 2b, shows an embodiment with the vacuum port having a reservoir with at least one port island. FIG. 2c, is another embodiment of a vacuum port 142 which comprises at least two port islands $126_a$ and $126_b$ and being surrounded by one ported groove $151_b$. Other embodiments of port islands shaped to resemble rectangular or triangular or other geometrical shapes are also possible if required.

FIG. 2d represents another embodiment of the end handler where the port island 126 of its vacuum port has at least one port reservoir $190_a$ with at least one vacuum opening 160 while the top surface of the port island 126 remains flush or co-planar with the surrounding surface of the end handler. FIGS. 2f and 2g represent separate embodiments where the vacuum port is comprised of a plurality of port reservoirs $190_b$, $190_c$ and/or $190_d$ with at least one vacuum opening 160. These port reservoirs may be viewed as discontinuous open channels that otherwise form the ported groove. FIG. 2h, FIG. 2i and FIG. 2j, are different embodiments that show, without limitation, other permutation and combination of reservoir and port island in configuring a vacuum port. FIG. 2j shows a vacuum port comprising a plurality of reservoirs surrounding a port island which contains a plurality of smaller reservoirs.

FIG. 2e represents another embodiment of the vacuum port 142 where the basic configuration of the vacuum port 142 in embodiment represented by FIG. 2b is repeated concentrically outwards. In such an embodiment, the vacuum port will have multiple port islands ($126_a$ and $126_b$) and multiple ported grooves ($151_d$ and $151_c$) configured concentrically outwards and where the port islands $126_a$ and $126_b$ are co-planar with one another and the surrounding surface of the end handler.

Such further embodiments in FIGS. 2c, 2d, 2e, 2f and 2g may be desirable or necessary if it is desired to enable a larger suction force to be applied over a larger area of engagement represented by the vacuum ports without distending or deforming the film of the film frame. The co-planarity of the port islands with the surrounding surface of the end handler ensures that they give support to the film to prevent distension while suction is applied through the ported grooves especially if the area of suction force to be applied through the vacuum port is relative larger. It is also conceivable, that if differentiated suction force is required to be applied to different vacuum ports located at strategic points on the end handler, different vacuum source can be made fluidly communicable with the relevant vacuum ports.

This system and method of handling is particular useful if the article to be handled is made of soft or pliable and substantially non-porous material materials.

Although, FIG. 1 shows the vacuum ports $142_a$, $142_b$, $142_c$, $142_d$ and $142_e$ being located at the support base portion $120a$ of the end handler $100$, it is conceivable that the at least one vacuum port may also be provided in other parts of the end handler if so desired. For example, the at least one vacuum port may be provided on the fingers of the end handler to facilitate better gripping.

The end handler as described above, for example, is used to handle film frames in semiconductor manufacturing processes. It is understood that the end handler may be used to handle any articles having a pliable surface. The end handlers may also be used in other types of manufacturing processes. For example, the end handlers may be applied to other industries or applications.

What is claimed is:

1. An end handler comprising:
   a mating portion for mating with a tool; and
   a support portion shaped to provide support to a film or film frame on a support surface of the support portion, the support portion comprising
   a support base section,
   extension sections extending from the support base section, and
   at least one configuration of vacuum ports,
   wherein the at least one configuration of vacuum ports comprise at least one vacuum port to distribute suction force,
   wherein the at least one vacuum port is formed by at least one indentation of the support surface of the support portion,
   at least one vacuum opening in fluid communication with a vacuum source, wherein the at least one vacuum opening is disposed within each of the at least one indentation,
   wherein the indentation has a surface opening which is relatively larger than the area of the at least one vacuum opening thereby increasing the suction force exerted on the film or film frame when the vacuum source is activated, and
   wherein the at least one configuration of vacuum ports is configured such that the remaining surfaces of the support portion not indented continue to provide support directly to the film or film frame to thereby reduce warping or distortion of the film while the at least one configuration of vacuum ports provides distributed magnified suction force on the film or film frame.

2. The end handler of claim 1, wherein the at least one vacuum opening is disposed at the base, near to the side walls or on the side walls of the at least one vacuum port.

3. The end handler of claim 1, wherein the at least one indentation of the support surface that forms the vacuum port comprises at least one channel with at least one vacuum opening therein such that the remaining portions of the support surface not indented and surrounded by an innermost channel forms at least one island that remains co-planar with the support surface, such that the innermost channel surrounds an island comprising the support surface not indented.

4. The end handler of claim 3, wherein the at least one channel forms a continuous ported groove that is configurable in different shapes and sizes.

5. The end handler of claim 3, wherein the at least one island comprises at least one indentation, each indentation having at least one vacuum opening therein that is in fluid communication with at least one vacuum source.

6. The end handler of claim 5, wherein the at least one configuration of vacuum ports comprises of repeating a configuration comprising a plurality of indentations arranged within any particular shape and size island concentrically outwards.

7. The end handler of claim 1, wherein the at least one vacuum port comprises at least one indentation such that the remaining portions of the support surface not indented remains co-planar with the support surface.

8. The end handler of claim 1, wherein each of the at least one indentation is configurable in different shapes and sizes.

9. The end handler of claim 1, wherein the at least one vacuum port comprises at least one configuration of vacuum ports.

10. The end handler of claim 9, wherein the at least one configuration of vacuum ports comprises repeating a configuration comprising at least one island within an at least one indentation concentrically outwards such that the first of the at least one island is spatially disposed within the first of the at least one indentation and forming a first ported groove, and is further spatially disposed within a larger and second of the at least one island, the second of the at least one island being spatially disposed within a larger and second of the at least one indentation and forming a second ported groove which surrounds the second at least one island and so on such that a penultimate indentation together with its island and ported groove will be disposed spatially within a larger ultimate island within a larger ultimate indentation forming an ultimate ported groove which surrounds the larger ultimate island.

11. The end handler of claim 9, wherein the at least one configuration of vacuum ports comprises of repeating a configuration comprising an indentation within an island concentrically outwards such that a first indentation is disposed within a first island and the first indentation and first island being disposed spatially within a second larger indentation and so on such that a penultimate indentation and island will be disposed spatially within a larger ultimate indentation.

12. The end handler of claim 1, wherein the at least one vacuum port is located on the support base section.

13. The end handler of claim 1, wherein the at least one vacuum port is located on the extension sections.

14. The end handler of claim 1, wherein the at least one vacuum source comprises a first and a second and successive vacuum source, each first and second and successive vacuum source having a differentiated vacuum force in fluid communication with a selected at least one vacuum port.

15. The end handler of claim 14, wherein the vacuum force to be exerted by the at least one vacuum port on the film frame is adjustable by software control.

16. A method of handling a film or film frame comprising:
   providing a mating portion for mating with a tool;
   shaping a support portion to support a film or film frame on a support surface of the support portion;
   providing a support base section for the support portion;

extending extension sections from the support base section;

providing at least one configuration of vacuum ports,
wherein the at least one configuration of vacuum ports comprise at least one vacuum port to distribute suction force,
wherein the at least one vacuum port is formed by at least one indentation of the support surface of the support portion,
disposing at least one vacuum opening in fluid communication with a vacuum source within each of the at least one indentation,
wherein the indentation has a surface opening which is relatively larger than the area of the at least one vacuum opening thereby increasing the suction force exerted on the film or film frame when the vacuum source is activated; and configuring the least one configuration of vacuum ports such that the remaining surfaces of the support portion not indented continue to provide support directly to the film or film frame to thereby reduce warping or distortion of the film while at least one configuration of vacuum ports provides distributed magnified suction force on the film or film frame.

17. A method of handling film frame of claim 16 wherein the vacuum port being means to hold down film frame has the configuration of the vacuum port defined in any of the above claims 1 to 15.

\* \* \* \* \*